US010022745B2

(12) United States Patent
Breingan et al.

(10) Patent No.: US 10,022,745 B2
(45) Date of Patent: Jul. 17, 2018

(54) APPARATUS FOR DUAL SPEED SPIN CHUCK

(71) Applicant: VEECO PRECISION SURFACE PROCESSING LLC, Horsham, PA (US)

(72) Inventors: William Gilbert Breingan, Media, PA (US); James K. Anders, Southampton, PA (US); Herman Itzkowitz, Bala Cynwyd, PA (US)

(73) Assignee: VEECO PRECISION SURFACE PROCESSING LLC, Horsham, PA (US)

( * ) Notice: Subject to any disclaimer, the term of this patent is extended or adjusted under 35 U.S.C. 154(b) by 0 days.

(21) Appl. No.: 14/445,736

(22) Filed: Jul. 29, 2014

(65) Prior Publication Data
US 2015/0037499 A1 Feb. 5, 2015

Related U.S. Application Data

(60) Provisional application No. 61/861,176, filed on Aug. 1, 2013.

(51) Int. Cl.
| | |
|---|---|
| *H01L 21/683* | (2006.01) |
| *B05C 11/08* | (2006.01) |
| *B05C 13/00* | (2006.01) |
| *B05D 1/00* | (2006.01) |
| *H01L 21/687* | (2006.01) |
| *B05C 1/08* | (2006.01) |
| *C23C 16/458* | (2006.01) |
| *C23C 14/50* | (2006.01) |

(52) U.S. Cl.
CPC ........ *B05C 13/00* (2013.01); *H01L 21/68792* (2013.01); *B05C 1/08* (2013.01); *B05D 1/005* (2013.01); *C23C 14/505* (2013.01); *C23C 16/4585* (2013.01); *C23C 16/4588* (2013.01); *H01L 21/6838* (2013.01)

(58) Field of Classification Search
USPC ............................. 118/500, 730; 156/345.55
See application file for complete search history.

(56) References Cited

U.S. PATENT DOCUMENTS

| | | | | |
|---|---|---|---|---|
| 3,783,822 A * | 1/1974 | Wollam | ............... | C23C 16/4584 118/725 |
| 4,860,687 A * | 8/1989 | Frijlink | ................... | C30B 25/12 108/138 |
| 5,415,691 A * | 5/1995 | Fujiyama | ................ | G03F 7/162 118/501 |
| 5,439,519 A * | 8/1995 | Sago | ........................ | B05C 11/08 118/501 |

(Continued)

*Primary Examiner* — Sylvia MacArthur
(74) *Attorney, Agent, or Firm* — Leason Ellis LLP

(57) ABSTRACT

A spin chuck according to the present invention is provided and is configured to eliminate the wrap of chemical over the wafer edge. The dual speed wafer spin chuck apparatus acts to prevent liquids from affecting the backside of a wafer during processing. An outer ring is placed around the wafer with a narrow gap between the two such that drops of liquid on the surface of the wafer will touch the outer ring as they move to the outermost edge of the wafer. By spinning this outer ring at high speed, centrifugal force causes these drops to be pulled off of the wafer and flung radially outward, thus preventing the liquid from affecting the backside of the wafer.

21 Claims, 3 Drawing Sheets

(56) References Cited

U.S. PATENT DOCUMENTS

| | | | | |
|---|---|---|---|---|
| 5,529,626 A * | 6/1996 | Stewart | ............... | G03F 7/162 |
| | | | | 118/319 |
| 5,688,322 A * | 11/1997 | Motoda | ............... | G03F 7/162 |
| | | | | 118/319 |
| 5,858,102 A * | 1/1999 | Tsai | ............... | C23C 16/4584 |
| | | | | 118/719 |
| 5,879,457 A * | 3/1999 | Sahoda | ............ | H01L 21/6715 |
| | | | | 118/319 |
| 5,961,169 A * | 10/1999 | Kalenian | ............ | B24B 37/30 |
| | | | | 269/21 |
| 5,989,342 A * | 11/1999 | Ikeda | .................. | B05C 11/08 |
| | | | | 118/319 |
| 6,827,814 B2 * | 12/2004 | Taniyama | ......... | H01L 21/6708 |
| | | | | 134/113 |
| 6,837,940 B2 * | 1/2005 | Komeno | .......... | C23C 16/4581 |
| | | | | 118/730 |
| 7,241,362 B2 * | 7/2007 | Shimbara | ............ | G11B 23/505 |
| | | | | 118/730 |
| 8,075,731 B2 * | 12/2011 | Miya | .............. | H01L 21/67051 |
| | | | | 118/715 |
| 8,231,939 B2 * | 7/2012 | Brugger | ............... | G03F 7/162 |
| | | | | 118/320 |
| 8,268,087 B2 * | 9/2012 | Kamikawa | ....... | H01L 21/67051 |
| | | | | 134/133 |
| 2003/0029384 A1 * | 2/2003 | Nishikawa | ......... | C23C 16/4584 |
| | | | | 118/730 |
| 2011/0240225 A1 * | 10/2011 | Yamada | .......... | B65H 23/0322 |
| | | | | 156/390 |
| 2015/0037499 A1 * | 2/2015 | Breingan | ......... | H01L 21/68792 |
| | | | | 427/240 |

\* cited by examiner

APPARATUS FOR DUAL SPEED SPIN CHUCK

CROSS-REFERENCE TO RELATED APPLICATION

The present invention claims the benefit of U.S. patent application Ser. No. 61/861,176, filed Aug. 1, 2013, which is hereby incorporated by reference in its entirety.

TECHNICAL FIELD

This invention relates to ways to hold semiconductor wafers during processing. In particular, this invention is a type of rotary chuck used during chemical processing of a wafer.

During the processing of semiconductor wafers the side of the wafer that is not being processed needs to be protected from the chemicals that are being used on the opposite active process side. In some cases a slight wrap around to the bevel is permissible, however there are operations where "zero wrap" is desired. The new design provides this capability.

BACKGROUND

During semiconductor wafer processing the side being processed may be either the top (active device side) or the back (non-device side). The terminology can become confusing. For the purpose of this description we will use the term TOPSIDE to identify the side of the wafer that is being processed and the term BACKSIDE to identify the side of the wafer that needs to be protected from chemical attack.

During the processing of semiconductor wafers the side of the wafer that is not being processed needs to be protected from the chemicals being dispensed on the opposite active side of the wafer.

In some cases a slight wrap around to the bevel and etching of the bevel is permissible. More recently, as devices have become larger, the exclusion zone around the edge of the wafer has been decreasing in width. Wrap of the chemical around the edge has become a problem due to attack of the active device.

Elimination of chemical wrap over the edge, "zero wrap," is being required for some process steps depending upon the chemicals used and the materials exposed.

The elimination of chemical wrap can be accomplished by spinning the wafer at higher speeds, thereby throwing chemistry from the edge of the wafer. However, this approach often has adverse effects on the processing of the wafer's topside.

This invention captures the benefit of increased rotational speed without the detrimental effects by adding a ring around the wafer that can be spun faster than the wafer during processing.

SUMMARY

The dual speed wafer spin chuck apparatus can be used for a variety of wafer processing operations, but it is intended primarily for use in acid etch applications.

The key element of the design of this chuck is to have nitrogen gas blown past the edge of the wafer to prevent acids from clinging to the wafer and wrapping around to etch the bottom side of the wafer. An outer ring is added that can be spun independently of the wafer to assist in throwing droplets of chemical off the edge and thereby enhance the protection of the wafer backside from chemical attack.

DETAILED DESCRIPTION OF CERTAIN EMBODIMENTS

Figure 1:
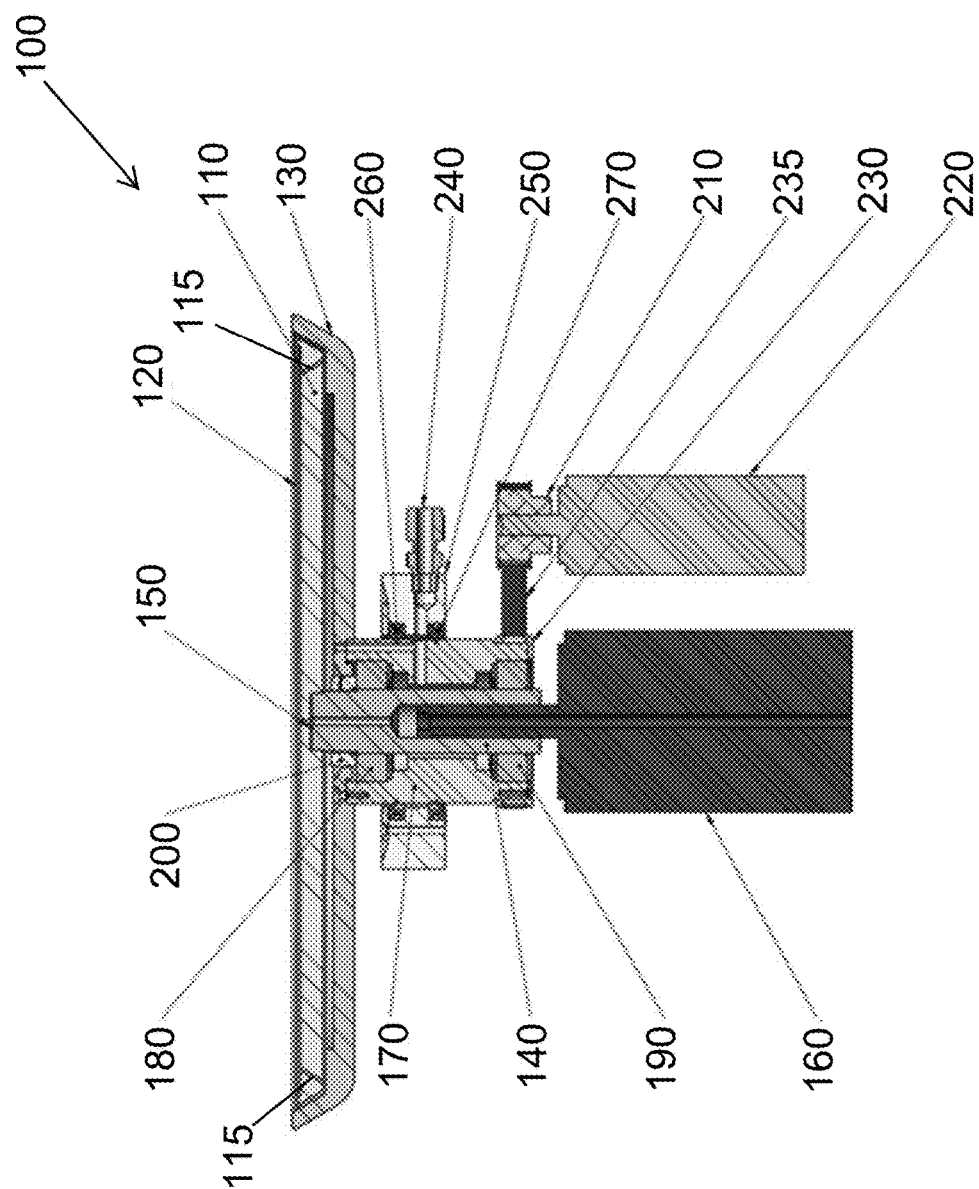
FIG. 1 is a cross section view of a dual speed wafer spin chuck apparatus in accordance with the present invention.
Figure 2:
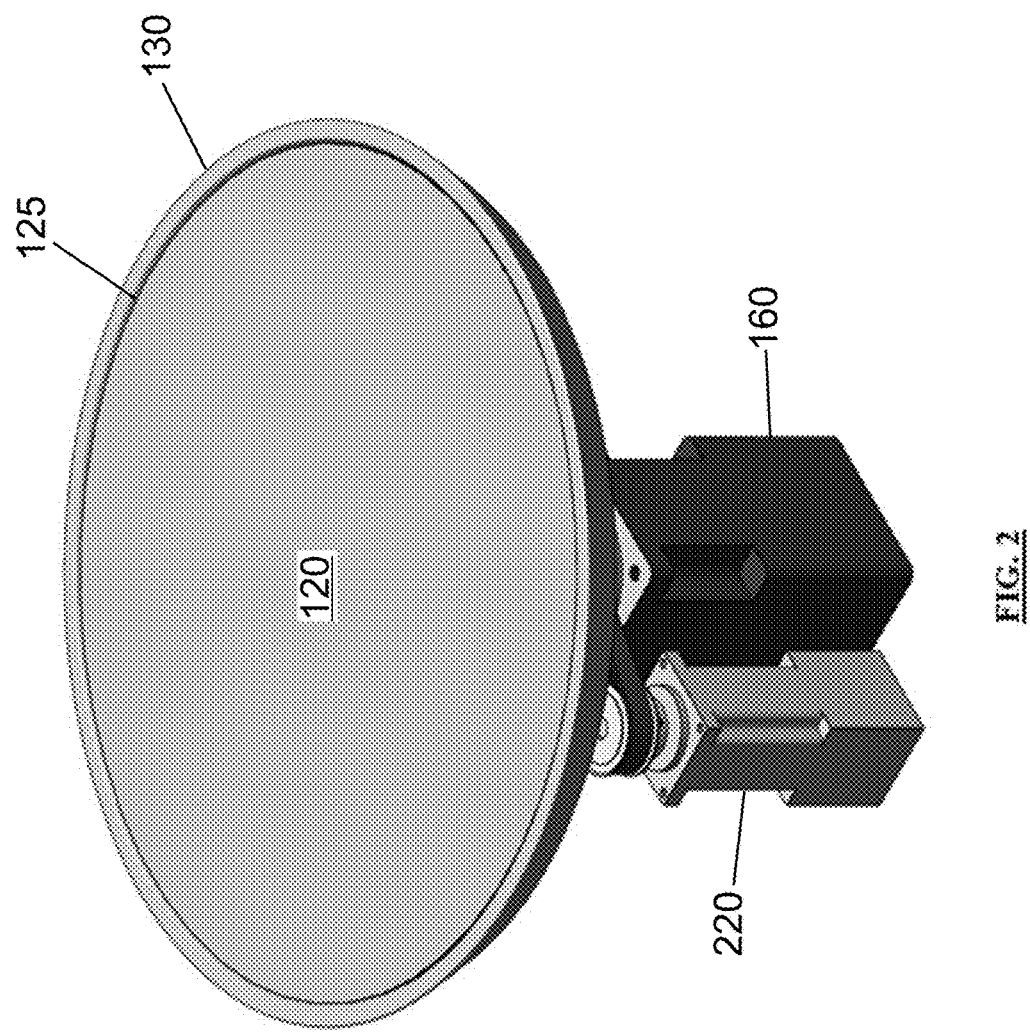
FIG. 2 is an isometric view of the apparatus.
Figure 3:
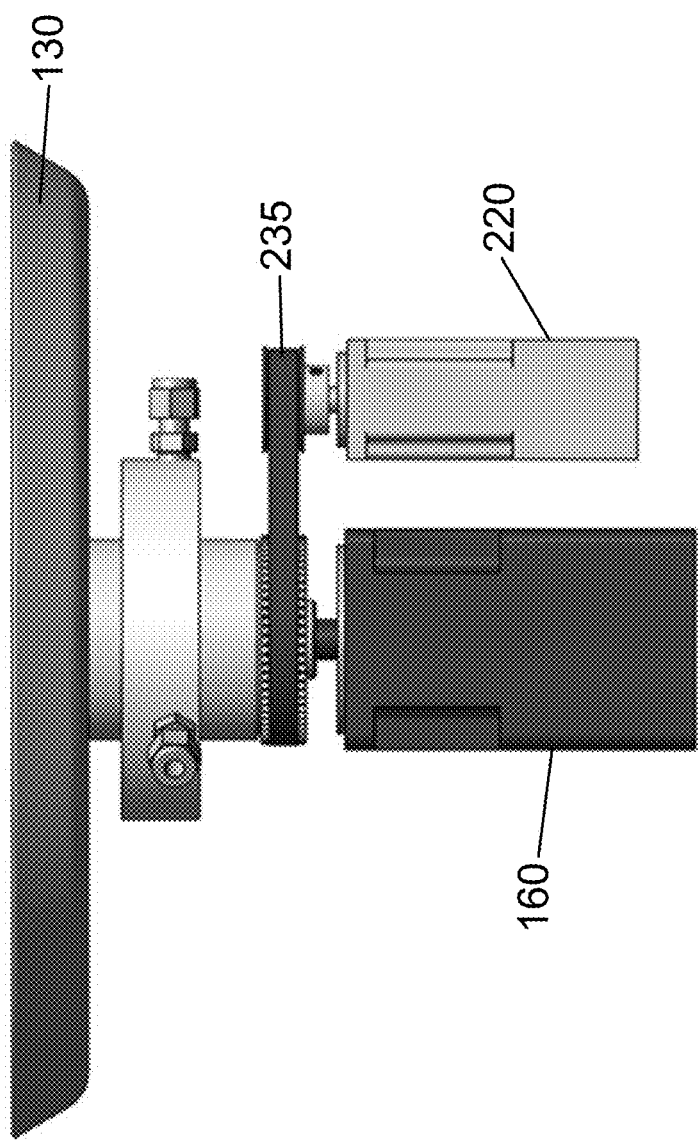
FIG. 3 is a side view of the apparatus.

FIGS. 1-3 illustrate a dual speed wafer spin chuck apparatus 100 in accordance with the present invention. The apparatus 100 is made up of a number of parts that cooperate with one another as disclosed below. More specifically, the apparatus 100 is formed of a vacuum platter (inner platter/inner wafer support member) 110, which holds and spins a wafer 120, and a shell platter (outer platter/outer ring) 130, which fits around the vacuum platter 110 and wafer 120 and, as shown, can have an outer upstanding peripheral edge (wall) that has an annular shape. A small gap 125 (FIG. 2) is maintained between the shell platter 130 and the wafer 120 so that drops of chemistry at the edge of the wafer will contact the surface of the shell platter 130. In the illustrated embodiment, the gap 125 has an annular shape. By spinning the shell platter 110 at a high RPM, these drops are pulled off of the wafer 120 and thrown radially outward, preventing them from clinging to the wafer 120 and wrapping around the edge to attack the backside. Additionally, gas may be blown through this gap to provide additional protection. As shown, the shell platter 130 and the wafer 120 have circular shapes according to the illustrated embodiment.

The vacuum platter 110 holds onto the wafer 120 when a vacuum is drawn within a shallow pocket cut into a top face of the vacuum platter 110. This vacuum may be generated by small diagonal holes 115 shown near the outside of the platter 110 when nitrogen is blown through the device (apparatus) 100. It will be appreciated that other vacuum means can be used to hold the wafer 120 in place.

The vacuum platter 110 is mounted to an inner spindle 140. A shim 150 is also included between the vacuum platter 110 and the inner spindle 140 to allow for fine adjustment of the vertical position of the vacuum platter 110. It will be understood that the shim 150 is adjusted to achieve a narrow gap between the wafer 120 and the shell platter 130.

Additionally a hole is provided through the vacuum platter 110, inner spindle 140, and a shaft of motor 160 so that wafer 120 presence can be detected with a vacuum transducer (not shown). The inner spindle 140 is attached to the motor 160.

The shell platter 130 is attached to an outer spindle 170. The outer spindle 170 mounts to the inner spindle 140 with bearings 180, 190 such that the two spindles 170, 140 spin concentrically, but at different speeds.

A clamp nut 200 which fits onto threads on the inner spindle 140 is used to preload the bearings 180, 190.

A pulley 210, is driven by motor 220, which turns a larger pulley 230 via a belt 235. This larger pulley 230 spins the outer spindle 170.

Holes are drilled in the shell platter 130 and outer spindle 170 to allow nitrogen gas to be blown through the apparatus and out between the shell platter 130 and wafer 120. Nitrogen gas is introduced to the assembly (apparatus 100) through a fitting 240 in a seal block 250. This gas is then guided into the outer spindle 170 by two lip seals 260, 270.

The present invention may be embodied in other specific forms without departing from its structures, methods, or other essential characteristics as broadly described herein and claimed hereinafter. The described embodiments are to be considered in all respects only as illustrative, and not restrictive. The scope of the invention is, therefore, indicated by the appended claims, rather than by the foregoing description. All changes that come within the meaning and range of equivalency of the claims are to be embraced within their scope.

What is claimed is:

1. An apparatus for holding and spinning a wafer comprising:
    an inner platter having a top surface that receives the wafer, wherein the inner platter is mounted to a rotatable inner spindle; and
    an outer platter that is disposed around the inner platter and wafer and includes an outer ring that surrounds an outer peripheral edge of the wafer, wherein the outer platter is mounted to a rotatable outer spindle, the outer spindle including an integral fluid channel formed therein and in fluid communication with the outer platter and with a fluid fitting that is external to the outer spindle and is configured for fluid coupling to a gas source;
    wherein the inner platter and the outer platter are configured such that the outer platter and the inner platter can concurrently rotate at different speeds and rotation of the inner platter is independent from rotation of the outer platter and the rotation of the inner patter and the outer platter can be independently controlled with respect to one another, thereby allowing the wafer to rotate at a different speed relative to the outer platter that surrounds the outer peripheral edge of the wafer.

2. The apparatus of claim 1, wherein the inner platter comprises a vacuum platter that is operatively connected to a vacuum source for establishing a vacuum along the top surface.

3. The apparatus of claim 2, where the vacuum is generated by blowing gas through the apparatus.

4. The apparatus of claim 1, wherein the inner platter and the outer platter are operatively coupled to two different motors that operate to independently rotate the inner platter and the outer platter.

5. The apparatus of claim 1, wherein an outer peripheral edge of the inner platter is an angled edge that is angled in an outward direction and an inner peripheral edge of the outer platter is angled and is parallel to the outer peripheral edge of the inner platter, wherein a gap exists between the wafer and the outer ring to allow liquid drops on an outer peripheral edge of the wafer to contact an inner surface of the outer ring before wrapping over to a backside of the wafer.

6. The apparatus of claim 5, wherein the gap between the outer ring and the wafer edge can be adjusted by installing different thickness shims between the inner platter and the inner spindle that is coupled to the inner platter.

7. The apparatus of claim 1, where the outer ring is rotated at a higher speed relative to the inner platter and the wafer so as to remove liquid from the wafer via centrifugal force.

8. The apparatus of claim 1, wherein the apparatus is configured such that gas is blown between the wafer and outer ring so as to blow liquid off of the wafer.

9. The apparatus of claim 1, wherein the apparatus is configured such that the wafer can be centered by moving the outer ring vertically up.

10. The apparatus of claim 1, wherein the apparatus is configured such that the wafer can be centered by moving the inner platter which carries the wafer vertically down.

11. The apparatus of claim 1, wherein wafer presence is sensed by measuring a vacuum pressure.

12. The apparatus of claim 1, wherein the outer ring and gap have continuous annular shapes.

13. An apparatus for holding and spinning a wafer comprising:
    an inner platter having a top surface that receives the wafer and being operatively connected to a first active drive; and
    an outer platter that is disposed around the inner platter and wafer and includes an outer ring that surrounds an outer peripheral edge of the wafer with a gap formed therebetween, the outer platter being operatively connected to a second active drive;
    wherein the inner platter and the outer platter are configured such that the inner platter and the outer platter are independently and actively driven by the first and second active drives respectively and can concurrently rotate at different speeds, thereby allowing the wafer to concurrently rotate at a different speed relative to the outer platter that surrounds the outer peripheral edge of the wafer;
    wherein in a chemical processing mode of operation, the wafer seats against the top surface of the inner platter and lies in a first plane and is free of contact with the outer platter, the first plane intersecting a top edge of the upper platter, the inner platter and the outer platter concurrently rotating with the outer platter rotating at a higher speed than the speed of the inner platter for pulling liquid droplets from the wafer in a radially outward direction, thereby preventing the liquid droplets from wrapping around a peripheral edge of the wafer;
    wherein the inner platter is mounted to a rotatable inner spindle which is coupled to the first active drive for imparting rotation to the inner platter and the outer platter is mounted to a rotatable outer spindle which is coupled to the second active drive for imparting rotation to the outer platter, the inner spindle and the outer spindle being concentrically arranged with a bearing disposed therebetween to allow independent rotation of the inner platter relative to the outer platter, the outer spindle including an integral fluid channel formed therein and in fluid communication with the outer platter and with a fluid fitting that is external to the outer spindle and is configured for fluid coupling to a gas source.

14. The apparatus of claim 13, wherein a size of the gap is selected such that drops of liquid delivered to a top surface of the wafer contact the outer ring as the drops move to an outermost edge of the wafer and the outer platter is rotated at the higher speed than the inner platter.

15. The apparatus of claim 13, wherein the first active drive comprises a first motor and wherein the second active drive comprises a second motor separate from the first motor.

16. The apparatus of claim 13, wherein the outer platter has a recessed center portion and raised peripheral side wall that defines the outer ring, the inner platter being disposed within the recessed center portion such that the raised peripheral side wall surrounds a peripheral edge of the inner platter, wherein the raised peripheral side wall and the peripheral edge comprise beveled edges.

17. The apparatus of claim 13, further including a shim disposed between the inner platter and the inner spindle for allowing fine adjustment of a vertical position of the inner platter and to permit adjustment of the gap between the wafer and the outer platter.

18. The apparatus of claim 13, wherein the bearing comprises a pair of bearings and a clamp nut is coupled to the inner spindle and acts to preload the pair of bearings.

19. The apparatus of claim 13, wherein the first active drive includes a first drive shaft that is coupled to the inner spindle and the second active drive is connected to the outer spindle such that rotation of the second active drive is translated into rotation of the outer spindle, the first drive axis defining a first axis about which the inner and outer spindles are concentrically arranged, the second active drive having a second drive shaft that is laterally offset from the first axis.

20. The apparatus of claim 19, wherein the first drive shaft is parallel to the second drive shaft.

21. The apparatus of claim 19, wherein the second active drive is connected to the outer spindle by a continuous belt that wraps around a first pulley that is connected to the second drive shaft and a second pulley that is connected to the outer spindle.

* * * * *